United States Patent
Yamamoto et al.

(10) Patent No.: US 8,993,351 B2
(45) Date of Patent: Mar. 31, 2015

(54) METHOD OF MANUFACTURING TUNNELING MAGNETORESISTIVE ELEMENT

(75) Inventors: Hiroki Yamamoto, Kanagawa (JP); Tadashi Morita, Kanagawa (JP); Hideo Ohno, Miyagi (JP); Shoji Ikeda, Miyagi (JP)

(73) Assignees: Tohoku University, Miyagi (JP); Ulvac, Inc., Kanagawa (JP)

(*) Notice: Subject to any disclaimer, the term of this patent is extended or adjusted under 35 U.S.C. 154(b) by 21 days.

(21) Appl. No.: 13/997,057
(22) PCT Filed: Dec. 20, 2011
(86) PCT No.: PCT/JP2011/007105
§ 371 (c)(1),
(2), (4) Date: Jun. 21, 2013
(87) PCT Pub. No.: WO2012/086183
PCT Pub. Date: Jun. 28, 2012

(65) Prior Publication Data
US 2013/0288398 A1    Oct. 31, 2013

(30) Foreign Application Priority Data
Dec. 22, 2010  (JP) ................. 2010-286112

(51) Int. Cl.
*H01L 21/00* (2006.01)
*H01L 43/10* (2006.01)
*H01L 43/12* (2006.01)
*H01L 43/08* (2006.01)

(52) U.S. Cl.
CPC .......... *H01L 43/12* (2013.01); *H01L 43/08* (2013.01); *H01L 43/10* (2013.01)
USPC ............... 438/3; 257/295; 257/E21.665

(58) Field of Classification Search
USPC ............... 257/295, E21.665; 438/3
See application file for complete search history.

(56) References Cited

U.S. PATENT DOCUMENTS

2012/0286382 A1* 11/2012 Jan et al. .......... 257/421
2012/0287696 A1* 11/2012 Ohmori et al. .......... 365/66

FOREIGN PATENT DOCUMENTS

JP    2008-098523 A    4/2008
KR    10-2006-0051048 A    5/2006

OTHER PUBLICATIONS

Ikeda, S. et al. "A perpendicular-anisotropy CoFeB—MgO magnetic tunnel junction" *Nature Materials*, Sep. 2010, 9:721-724.

(Continued)

*Primary Examiner* — Minh-Loan Tran
(74) *Attorney, Agent, or Firm* — Saliwanchik, Lloyd & Eisenschenk

(57) ABSTRACT

[Object] To provide a method of manufacturing a perpendicular magnetization-type magnetic element, which does not need a step of depositing MgO.
[Solving Means] The method of manufacturing a magnetoresistive element 1 according to the present invention includes laminating a first layer 30 on a base 10, the first layer 30 including a material containing at least one of Co, Ni, and Fe. Next, a second layer 40 is laminated on the first layer 30, the second layer 40 including Mg. Next, the Mg in the second layer 40 is oxidized to form MgO by applying an oxidation treatment to a laminated body including the first layer 30 and the second layer 40. Next, the second layer 40 is crystallized by applying a heat treatment to the laminated body, and the first layer 30 is caused to be perpendicularly magnetized. According to the manufacturing method, it is possible to manufacture a perpendicular magnetization-type CoFeB—MgO magnetic element without causing a problem arising from the deposition of MgO.

7 Claims, 5 Drawing Sheets

(56) References Cited

OTHER PUBLICATIONS

Oh, S.C. et al. "Magnetic and Electrical Properties of Magnetic Tunnel Junctions With Radical Oxidized MgO Barriers" *IEEE Transactions on Magnetics*, Oct. 2006, 42(10):2642-2644.

International Search Report in International Application No. PCT/JP2011/007105, filed Dec. 20, 2011.

Office Action in Korean Application No. 10-2013-7015987, dated Aug. 28, 2014.

* cited by examiner

METHOD OF MANUFACTURING TUNNELING MAGNETORESISTIVE ELEMENT

CROSS-REFERENCE TO RELATED APPLICATIONS

This application is the U.S. national stage application of International Patent Application No. PCT/JP2011/007105, file Dec. 20, 2011, which claims priority to Japanese Application No. 2010-286112, filed Dec. 22, 2010, the disclosure of each of which are incorporated herein by reference in their entirety.

TECHNICAL FIELD

The present invention relates to a method of manufacturing a perpendicular magnetization-type tunneling magnetoresistive element.

BACKGROUND ART

Research and development on a tunneling magnetoresistive (TMR) element using "a magnetoresistive effect" in which electrical resistance changes in response to a magnetic field are being conducted in the field of MRAM (magnetoresistive random access memory), a magnetic sensor, or the like. The tunneling magnetoresistive element has a configuration in which an insulating layer (tunnel barrier layer) is sandwiched between two magnetic layers, and a current between the magnetic layers (tunneling current) varies depending on the difference in the magnetization directions of the magnetic layers.

The tunneling magnetoresistive element in which the magnetization directions of the magnetic layers are perpendicular to the lamination direction is called "in-plane magnetization-type", and the tunneling magnetoresistive element in which the magnetization directions of the magnetic layers are the same as the lamination direction is called "perpendicular magnetization-type." The perpendicular magnetization-type tunneling magnetoresistive element has advantages such as possible size reduction of the element, high thermal disturbance resistance, and a small magnetization inversion current, as compared with the in-plane magnetization-type tunneling magnetoresistive element. However, because the properties of the element significantly differ depending on the material of each layer, crystallinity, or the like, a configuration of the element having more excellent properties is being searched for.

In particular, an element having a configuration in which a magnetic layer includes CoFeB (cobalt iron boron) material (CoFeB, CoFeBP, and the like), and an insulating layer includes MgO (magnesium oxide) is investigated as a perpendicular magnetization-type tunneling magnetoresistive element having excellent properties. For example, Patent Document 1 describes a perpendicular magnetization-type MTJ (Magnetic Tunnel Junction) element in which an interface fixed layer includes a CoFeB alloy, and a tunnel barrier layer includes MgO. In this element, the tunnel barrier layer including MgO is deposited on the interface fixed layer including a CoFeB alloy. Accordingly, it is possible to improve the crystallinity of MgO, and to produce an element having a high MR (Magnetic Resistance) ratio and high spin injection efficiency.

CITATION LIST

Patent Document

Patent Document 1: Japanese Patent Application Laid-open No. 2008-098523 (paragraph [0078], FIG. 4)

DISCLOSURE OF THE INVENTION

Problem to be Solved by the Invention

In the manufacturing method described in Patent Document 1), however, the following problems are considered to occur in the step of depositing an MgO film. Specifically, when depositing an MgO film by a sputtering method, MgO attaches to and removes from the inner wall of a deposition chamber, thereby generating a lot of dust, which adversely affects the element. Moreover, MgO being an insulating material is deposited on the inner wall of the deposition chamber having a ground potential, which causes the surface of the MgO film to be electrically charged. Accordingly, arc discharge is generated, which causes plasma damage on the MgO film. These problems are caused because the deposition material includes MgO being a metal oxide.

In view of the circumstances as described above, it is an object of the present invention to provide a method of manufacturing a perpendicular magnetization-type magnetoresistive element, which does not need a step of depositing MgO, Means for Solving the Problem In order to achieve the above-mentioned object, a method of manufacturing a magnetoresistive element according to an embodiment of the present invention includes laminating a first layer on a base, the first layer including a material containing at least one of Co, Ni, and Fe.

A second layer is laminated on the first layer, the second layer including Mg.

The Mg in the second layer is oxidized to form MgO by applying an oxidation treatment to a laminated body including the first layer and the second layer.

The second layer is crystallized by applying a heat treatment to the laminated body, and the first layer is caused to be perpendicularly magnetized,

MODE(S) FOR CARRYING OUT THE INVENTION

Figure 1:
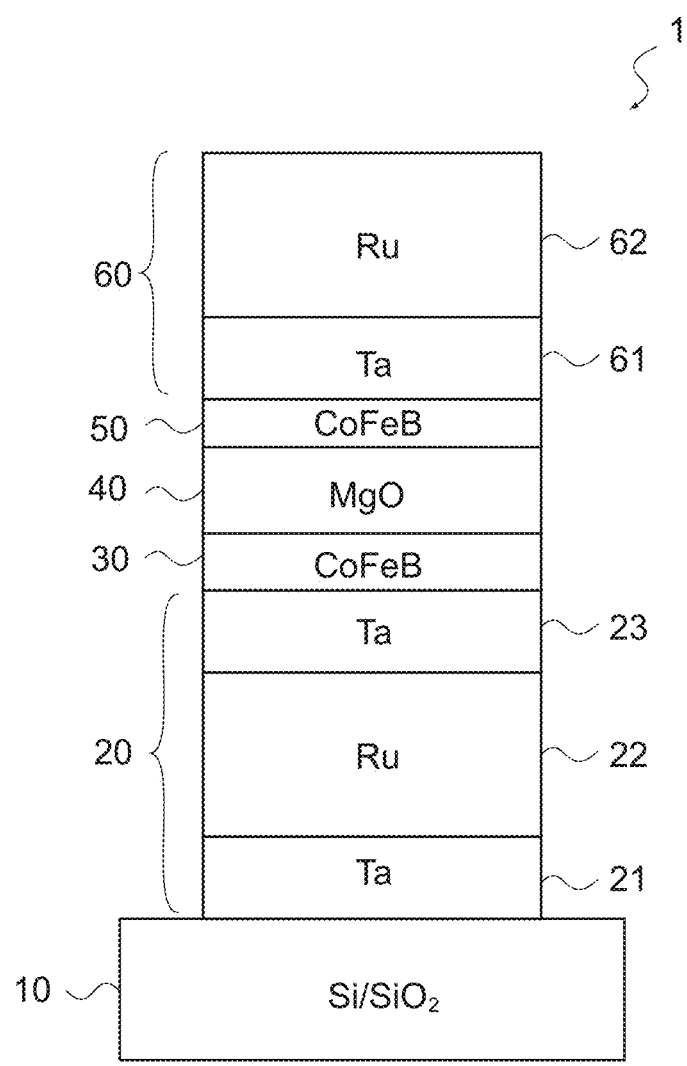
FIG. 1 is a schematic diagram showing the laminate configuration of magnetoresistive elements according to first and second embodiments.

A method of manufacturing a magnetoresistive element according to an embodiment of the present invention includes laminating a first layer on a base, the first layer including a material containing at least one of Co, Ni, and Fe.

A second layer is laminated on the first layer, the second layer including Mg.

The Mg in the second layer is oxidized to form MgO by applying an oxidation treatment to a laminated body including the first layer and the second layer.

The second layer is crystallized by applying a heat treatment to the laminated body, and the first layer is caused to be perpendicularly magnetized.

According to the manufacturing method, it is possible to manufacture a perpendicular magnetization-type magnetoresistive element without depositing MgO being a metal oxide. Accordingly, it is possible to prevent the problem caused due to the deposition of MgO, i.e., that when depositing MgO, MgO attaches to and removes from the inner wall of a deposition chamber, thereby generating a lot of dust, which adversely affects the element. Moreover, MgO being an insulating material is deposited on the inner wall of the deposition chamber having a ground potential, thereby preventing the film quality of the MgO film from changing. Furthermore, for example, negatively charged oxygen plasma and a negatively charged sputtering gas ion repel each other, thereby preventing plasma damage from being caused on the MgO film.

The method of manufacturing a magnetoresistive element may further including laminating a third layer on the second layer after the step of applying the oxidation treatment to the laminated body and before the step of applying the heat treatment to the laminated body, the third layer including a material containing at least one of Co, Ni, and Fe, and causing the third layer to be perpendicularly magnetized in the step of applying the heat treatment to the laminated body.

According to the manufacturing method, it is possible to create a laminate configuration in which a crystallized layer including MgO, which is formed of the second layer, is sandwiched between crystallized and perpendicularly magnetized two layers including a material containing at least one of Co, Ni, and Fe, which are formed of the first layer and the third layer. The perpendicular magnetization of the above-mentioned first layer and the above-mentioned third layer, and the crystallization of the second layer may be performed in one heat treatment step. It is possible to improve the productivity as compared with the case where these steps are separate steps.

The method of manufacturing a magnetoresistive element may further include laminating a third layer on the second layer after the step of applying the heat treatment to the laminated body, the third layer including a material containing at least one of Co, Ni, and Fe, and causing the third layer to be perpendicularly magnetized by applying a heat treatment to the laminated body.

According to the manufacturing method, it is possible to create a laminate configuration in which a crystallized layer including MgO, which is formed of the second layer, is sandwiched between crystallized and perpendicularly magnetized two layers including a material containing at least one of Co, Ni, and Fe, which are formed of the first layer and the third layer. Because the heat treatment step of the first layer is different from the third heat treatment step, it is possible to cause the first layer and the third layer to be perpendicularly magnetized in separate conditions, in the case where, for example, film thicknesses of the layers are different from each other. Therefore, the degree of freedom in the manufacturing process can be improved.

The first layer and the third layer may include a CoFeB material, in the step of laminating the first layer, the first layer may be laminated so as to have a thickness of not less than 0.6 nm and not more than 1.5 nm, and in the step of laminating the third layer, the third layer may be laminated so as to have a thickness of not less than 0.6 nm and not more than 1.5 nm.

The magnetoresistive element in which the magnetic layer includes a CoFeB material and the insulating layer includes MgO is normally an in-plane magnetization-type magnetoresistive element whose magnetization direction is perpendicular to the lamination direction. However, also in this case, it has been found that the CoFeB material has a perpendicular anisotropy component in the vicinity of the interface of the magnetic layer and the insulating layer. In view of the above, by laminating each of the first layer and the second layer so as to have a film thickness of not less than 0.6 nm and not more than 1.5 nm, it is possible to manufacture a perpendicular magnetization-type CoFeB—MgO magnetoresistive element.

In the step of laminating the first layer, the first layer may be laminated directly on a fourth layer including Ta, and the method of manufacturing a magnetoresistive element according to claim 4 may further include laminating a fifth layer directly on the third layer, the fifth layer including Ta.

According to the manufacturing method, it is possible to create a laminate configuration in which the first layer is adjacent to the fourth layer, and the third layer is adjacent to the fifth layer. The CoFeB material being in contact with Ta causes perpendicular magnetization due to a contribution of Ta when being crystallized. Therefore, by the manufacturing method, it is possible to manufacture a perpendicular magnetization-type CoFeB—MgO magnetoresistive element.

Hereinafter, embodiments according to the present invention will be described with reference to the drawings.

(First Embodiment)

A first embodiment of the present invention will be described.

[Configuration of Tunneling Magnetoresistive Element]

Figure 2:
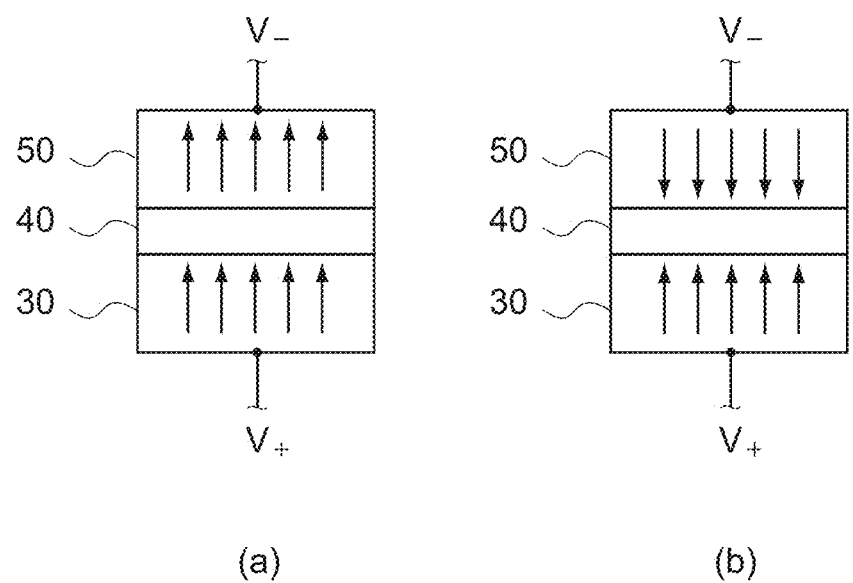
FIG. 2 is a schematic diagram showing the magnetization direction of the magnetoresistive element.

A configuration of a tunneling magnetoresistive element manufactured by a method of manufacturing a tunneling magnetoresistive element according to this embodiment will be described. FIG. 1 is a schematic diagram showing the laminate configuration of the tunneling magnetoresistive element (hereinafter referred to as TMR element). It should be noted that the TMR element according to this embodiment is a "perpendicular magnetization-type" TMR element in which the magnetization direction is the same as the lamination direction. Moreover, FIG. 2 is a conceptual diagram showing the magnetization direction of a TMR element 1, and the magnetization direction is represented by arrows. FIG. 2(*a*) shows "magnetization parallel state," and FIG. 2(*b*) shows "magnetization antiparallel state."

As shown in FIG. 1, the TMR element 1 has a layered configuration in which a buffer layer 20, a pinned layer 30, a barrier layer 40, a free layer 50, and a capping layer 60 are laminated on a substrate 10 in the stated order. It should be noted that the configuration of the TMR element 1 shown here is an exemplary configuration of an element manufactured by the manufacturing method according to this embodiment.

The substrate 10 is a substrate supporting each layer, and may include Si/SiO$_2$, which is formed by thermal oxidation of Si. Moreover, the substrate 10 may include another material such as ceramic and glass.

The buffer layer 20 is a layer for smoothing and uniformly crystallizing the adjacent pinned layer 30. As shown in FIG. 1, the buffer layer 20 is formed of a Ta (tantalum) layer 21, an Ru (ruthenium) layer 22, and a Ta layer 23, which are laminated on the substrate 10 in the stated order. The Ta layer 23 contributes to good crystallization of CoFeB forming the pinned layer 30, which will be described later. Regarding the thickness of each layer, for example, the Ta layer 21 may have a thickness of 5 nm, the Ru layer 22 may have a thickness of 10 nm, and the Ta layer 23 may have a thickness of 5 nm. It should be noted that the configuration of the buffer layer 20 is not limited to that shown here.

The pinned layer 30 is a layer in which the magnetization direction is fixed. It should be noted that the "pinned layer" is also called a "fixed layer" or a "ferromagnetic layer." As shown in FIG. 2(a) and (b), the magnetization direction of the pinned layer 30 is the same as the lamination direction of the TMR element 1, and the magnetization directions are the same in the magnetization parallel state shown in FIG. 2(a) and in the magnetization antiparallel state shown in FIG. 2(b).

The pinned layer 30 may include a CoFeB (cobalt iron boron) crystal having a (001) orientation. In CoFeB, the composition ratio of x and y in $Co_xFe_yB_{(1-x+y)}$ may be $0.2 \leq x \leq 0.4$ and $0.4 \leq y \leq 0.6$ in $Co_xFe_yB_{(1-x+y)}$. Moreover, the pinned layer 30 may include, instead of CoFeB, a CoFeB material, which has similar characteristics to those of CoFeB, i.e., a material obtained by adding P (phosphorous) or C (carbon) to CoFeB. The pinned layer 30 favorably has a thickness of not less than 0.6 nm and not more than 1.5 nm.

Moreover, the pinned layer 30 may include, instead of the CoFeB material, a material containing at least one of Co, Ni, and Fe. Examples of such a material include CoFe and FeNi.

The barrier layer 40 is a layer forming a "tunnel barrier" between the pinned layer 30 and the free layer 50. The "barrier layer" is also called a "non-magnetic layer" or an "insulating layer." It is favorable that the barrier layer 40 has a large difference in the magnetization directions of the pinned layer 30 and the free layer 50 (shown in FIG. 2), i.e., has a large MR (magnetoresistance) ratio.

The barrier layer 40 may include an MgO (magnesium oxide) crystal having a (001) orientation. The MgO crystal having a (001) orientation favorably has a composition ratio of Mg:O=1:1. By the regular crystallinity, the MgO crystal can have a small amount of scattering of a tunneling current (having a wave nature), as compared with that of another material, and can obtain a high MR (magnetoresistance) ratio. The thickness of the barrier layer 40 may be, for example, 0.8 nm.

The free layer 50 is a layer in which the magnetization direction is not fixed (invertible). It should be noted that the "free layer" is also called a "free layer" or a "ferromagnetic layer," As shown in FIG. 2(a) and (b), the magnetization direction of the free layer 50 is the same as the lamination direction of the TMR element 1, and the magnetization directions are opposite to each other in the magnetization parallel state shown in FIG. 2(a) and the magnetization antiparallel state shown in FIG. 2(b).

The free layer 50 may include a CoFeB crystal having a (001) orientation. In CoFeB, the composition ratio of x and y in $Co_xFe_yB_{(1-x+y)}$ may be $0.2 \leq x \leq 0.4$ and $0.4 \leq y \leq 0.6$. Moreover, the pinned layer 30 may include, instead of CoFeB, a CoFeB material, which has similar characteristics to those of CoFeB. The free layer 50 favorably has a thickness of not less than 0.6 nm and not more than 1.5 nm. It is possible to form the free layer 50 and the pinned layer 30 by a CoFeB material having the same composition.

Moreover, the free layer 50 may include, instead of the CoFeB material, a material containing at least one of Co, Ni, and Fe. Examples of such a material include CoFe and FeNi.

It should be noted that a CoFeB—MgO TMR element formed of CoFeB and MgO is normally an in-plane magnetization-type MIR element. However, there exists a perpendicular magnetic anisotropy component in the vicinity of the interface of CoFeB and MgO. The TMR element 1 according to this embodiment forms a perpendicular magnetization-type CoFeB—MgO TMR element by optimizing the film thicknesses of the pinned layer 30 and the free layer 50, which include CoFeB.

The capping layer 60 is a layer for stabilizing the electrical connection between the free layer 50 and a wiring, and for facilitating the uniform crystallization of the adjacent free layer 50. As shown in FIG. 1, the capping layer 60 is formed of a Ta layer 61 and an Ru layer 62, which are laminated on the free layer 50 in the stated order. The Ta layer 61 contributes to good crystallization of CoFeB forming the free layer 50. Regarding the thickness of each layer, for example, the Ta layer 61 may have a thickness of 5 nm, and the Ru layer 62 may have a thickness of 10 nm. It should be noted that the configuration of the capping layer 60 is not limited to that shown here.

The TMR element 1 is configured as described above. In the TMR element 1, wirings are connected to the buffer layer 20 and the capping layer 60. Specifically, as shown in FIG. 2, a cathode ($V_+$) is connected to the Ta layer 23 in the buffer layer 2, and an anode ($V_-$) is connected to the Ru layer 62 in the capping layer 60.

The operation of the TMR element 1 will be simply described. When a magnetic field is externally applied to the TMR element 1, the magnetization direction of the pinned layer 30 is not changed, while the magnetization direction of the free layer 50 is inverted depending on the magnetic field. Specifically, it is possible to arbitrary switch the magnetization parallel state shown in FIG. 2(a) and the magnetization antiparallel state shown in FIG. 2(b).

Here, as shown in FIG. 2(a), in the case where the magnetization direction of the pinned layer 30 is the same as the magnetization direction of the free layer 50, the tunnel barrier of the barrier layer 40 becomes small, and a large tunneling current flows between the pinned layer 30 and the free layer 50. Specifically, the TMR element 1 has reduced electrical resistance. On the other hand, as shown in FIG. 2(b), in the case where the magnetization direction of the pinned layer 30 is not the same as the magnetization direction of the free layer 50, the tunnel barrier of the barrier layer 40 becomes large, and the tunneling current between the pinned layer 30 and the free layer 50 becomes small. Specifically, the TMR element 1 has increased electrical resistance.

Therefore, if a current is applied to the TMR element 1, it is possible to determine whether the TMR element 1 is in the magnetization parallel state or in the magnetization antiparallel state by the amount of electrical resistance. For example, by assigning "0" or "1" to each state, it is possible to use the TMR element 1 as a memory (MRAM: Magnetoresistive Random Access Memory).

[Manufacturing Apparatus for Tunneling Magnetoresistive Element]

A manufacturing apparatus for the TMR element 1 configured as described above will be described.

Figure 3:
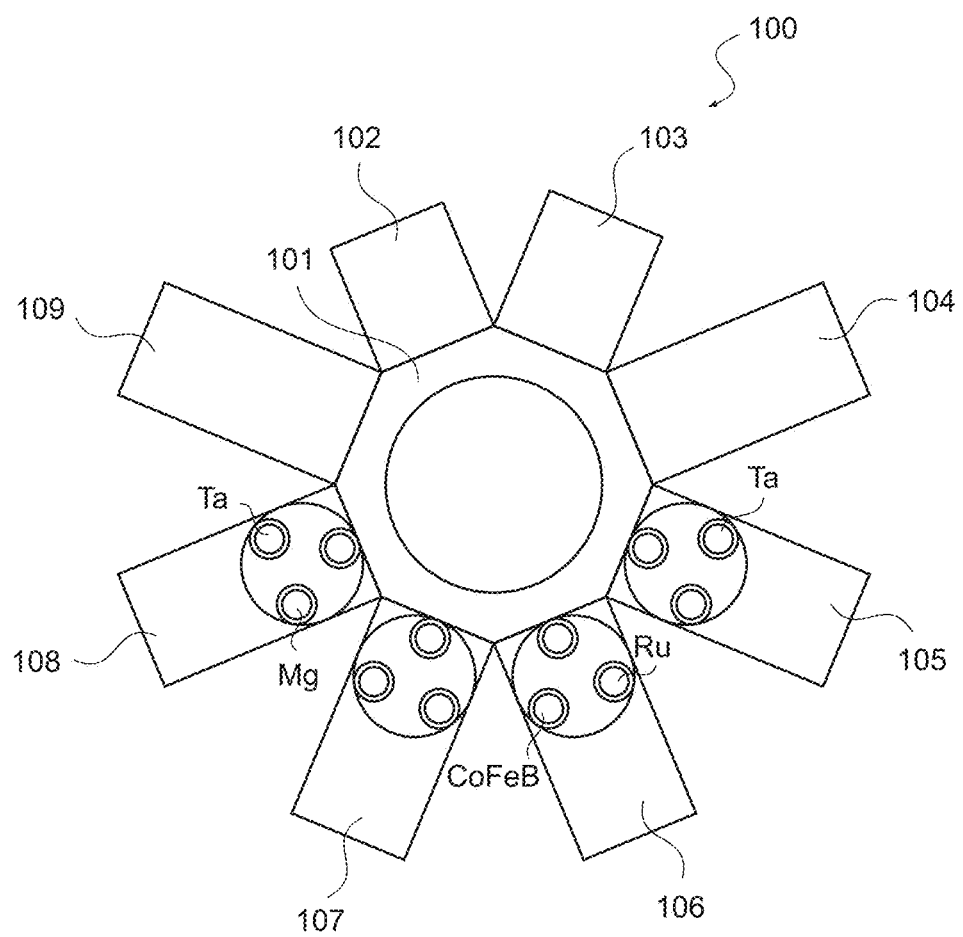
FIG. 3 is a schematic diagram showing a manufacturing apparatus for the magnetoresistive element.

FIG. 3 is a schematic diagram schematically showing a manufacturing apparatus 100 for the TMR element 1. The manufacturing apparatus 100 is an apparatus for manufacturing the TMR element 1 by depositing each layer on the carried substrate 10, and is used in a method of manufacturing the TIM, element 1, which will be described later. It should be noted that the manufacturing apparatus 100 is an exemplary manufacturing apparatus for the TMR element 1 and may have a different configuration.

As shown in FIG. 3, the manufacturing apparatus 100 is configured as a multi chamber. The manufacturing apparatus 100 includes a transfer chamber 101, an introduction chamber 102, a heating chamber 103, a cleaning chamber 104, a first PVD (physical vapor deposition) chamber 105, a second PVD chamber 106, a third PVD chamber 107, a fourth PVD chamber 108, and a oxidation chamber 109. Each of the chambers from the introduction chamber 102 to the oxidation chamber 109 is hermetically connected to the transfer chamber 101.

The introduction chamber 102 is a chamber for introducing the substrate 10 into the transfer chamber. In the introduction chamber 102, an introduction apparatus (not shown) for carrying the substrate chamber 10 in the introduction chamber is provided. The transfer chamber 101 houses a transfer apparatus (not shown), and the transfer apparatus transfers the substrate 10, which is introduced from the introduction chamber 102, to each chamber. The heating chamber 103 is a chamber, which heats the introduced substrate 10 and applies a degassing treatment. The cleaning chamber 104 is a chamber, which includes an LT-ICP (Long-Throw-Inductively-Coupled Plasma) source and applies a cleaning treatment to the substrate 10 before deposition.

The first PVD chamber 105, the second PVD chamber 106, the third PVD chamber 107, and the fourth PVD chamber 108 are chambers, which deposit various materials on the substrate 10. Each PVD chamber may house a DC (Direct Current) sputtering apparatus. Moreover, instead of the DC sputtering apparatus, each PVD chamber may house a deposition apparatus such as RF (Radio Frequency) sputtering. However, the DC sputtering apparatus is favorable because the sputtering cathode has a simple configuration. Unlike this embodiment, in the case where a metal oxide such as MgO is deposited, there is a need to use RF sputtering. However, in this embodiment, because a metal oxide is not deposited, it is possible to use DC sputtering.

The sputtering apparatus provided in each PVD chamber may be a sputtering apparatus having a ternary system in which three sputtering targets are provided. In the first PVD chamber 105, a Ta target is provided. Other two targets are not used for manufacturing of the TMR element 1. In the second PVD chamber 106, a CoFeB target and an Ru target are provided. The third PVD chamber 107 is not used for manufacturing of the TMR element 1. In the fourth PVD chamber 108, an Mg target and a Ta target are provided. As described above, since the sputtering apparatus has a ternary system, it is possible to form a film so as to have a uniform film thickness. However, the sputtering apparatus does not necessarily have a ternary system.

Although the details will be described later, the oxidation chamber 109 is a chamber for oxidizing the deposited Mg metal to form MgO. The oxidation chamber 109 may oxidize the Mg metal through any one of various oxidation processes such as plasma oxidation, radical oxidation, and natural oxidation. Specifically, in the case of plasma oxidation, the oxidation chamber 109 may house an ISM (Inductively Super Magnetron) plasma source or an Lt-ICP source. Moreover, in the case of radical oxidation, the oxidation chamber 109 may house an oxygen radical source. In the case of natural oxidation, the oxidation chamber 109 may house an oxygen gas source and a substrate heating source for producing a high-pressure (high-pressure compared to vacuum, about several Pa to several hundred Pa) oxygen atmosphere.

The manufacturing apparatus 100 for the TMR element 1 is configured as described above.

[Manufacturing Method for Tunneling Magnetoresistive Element]

A manufacturing method for the TMR element 1 using the manufacturing apparatus 100 will be described.

Figure 4:
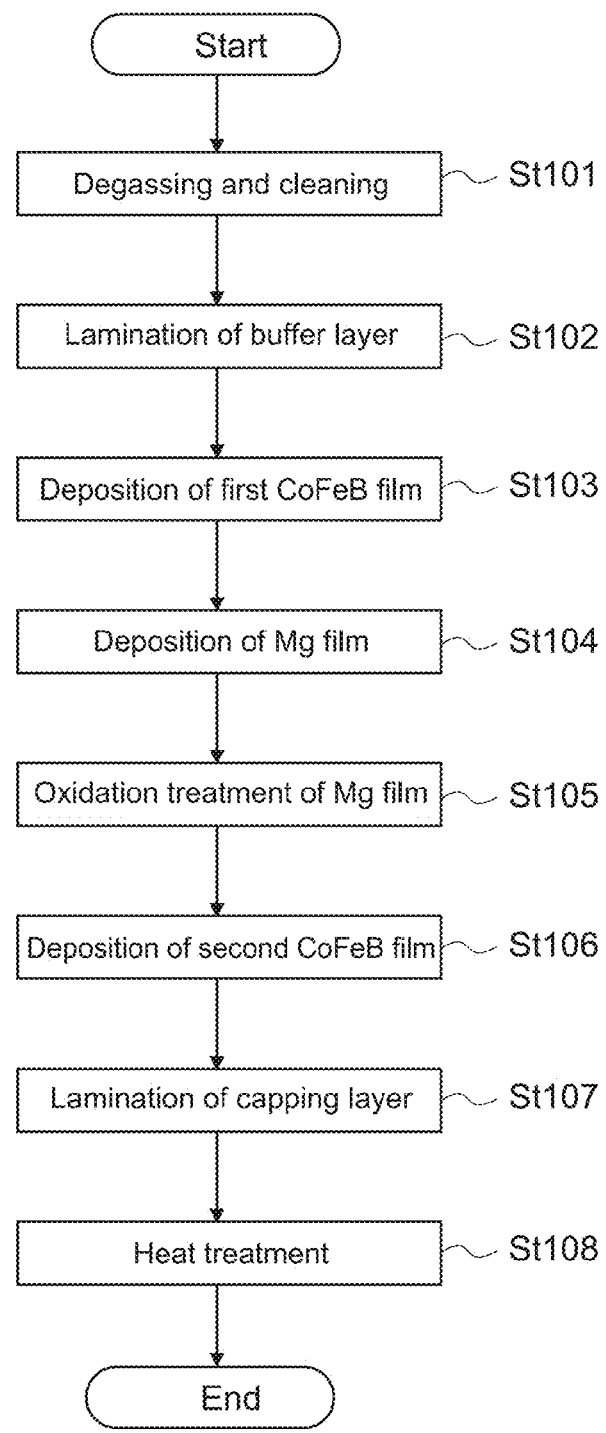
FIG. 4 is a flowchart showing a method of manufacturing the magnetoresistive element according to the first embodiment.

FIG. 4 is a flowchart showing a manufacturing method for the TMR element 1.

"Degassing and Cleaning (St101)"

When the substrate 10 is set in the introduction apparatus, the introduction apparatus carries the substrate 10 in the transfer chamber 101 via the introduction chamber 102. The transfer apparatus carries the substrate 10 in the heating chamber 103, and the substrate 10 is heated in the heating chamber 103 and degassed. Next, the transfer apparatus carries the substrate 10 in the cleaning chamber 104, and the substrate 10 is cleaned by plasma in the cleaning chamber 104.

"Lamination of Buffer Layer (St 102)"

Next, the transfer apparatus carries the substrate 10 in the first PVD chamber 105. In the first PVD chamber, the Ta layer 21 is deposited on the substrate 10 using a Ta target by DC sputtering. The deposition conditions may include Ar gas pressure of 0.02 to 0.1 Pa, DC power of 50 to 400 W, and room temperature. The deposition conditions are the same in the following layers. Under the conditions, the deposition rate is about 0.3 to 1.2 nm/sec. It should be noted that here, the Ta layer 21 is deposited by DC sputtering. However, the Ta layer 21 may be deposited by different sputtering such as RF sputtering, and the same holds true for the deposition of the following layers. For example, the Ta layer 21 is deposited so as to have a thickness of 5 nm. Hereinafter, a thing obtained by depositing each layer on the substrate 10 is called a "laminated body."

Next, the transfer apparatus carries the laminated body in the second PVD chamber 106. In the second PVD chamber, the Ru layer 22 is deposited on the Ta layer 21 using an Ru target by DC sputtering. For example, the Ru layer 22 is deposited so as to have a thickness of 10 nm.

Next, the transfer apparatus carries the laminated body in the first PVD chamber 105 again. In the first PVD chamber, the Ta layer 23 is deposited on the Ru layer 22 using a Ta target by DC sputtering. For example, the Ta layer 23 is deposited so as to have a thickness of 5 nm.

In this way, the buffer layer 20 including the Ta layer 21, the Ru 22, and the Ta layer 23 is laminated.

"Deposition of First CoFeB Film (St103)"

Next, the transfer apparatus carries the laminated body in the second PVD chamber 106. In the second PVD chamber 106, a first CoFeB film including CoFeB is deposited on the Ta layer 23 using a CoFeB target by DC sputtering. Moreover, in the case where a CoFeB material is deposited instead of CoFeB, a CoFeB—X target is further added (X is a material added to CoFeB). The first CoFeB film is in an amorphous state, and becomes the pinned layer 30 in a step to be described later. The composition ratio of the first CoFeB film can be controlled by the target composition, and, for example, the composition ratio of x and y in $Co_xFe_yB_{(1-x+y)}$ may be $0.2 \leq x \leq 0.4$ and $0.4 \leq y \leq 0.6$. Moreover, for example, the first CoFeB film is deposited so as to have a thickness of not less than 0.6 nm and not more than 1.5 nm.

"Deposition of Mg Film (St104)"

Next, the transfer apparatus carries the laminated body in the fourth PVD chamber 108. In the fourth PVD chamber 108, an Mg film is deposited on the first CoFeB film using an Mg target by DC sputtering. The Mg film is in an amorphous state, and becomes the barriers layer 40 in a step to be described later. For example, the Mg film is deposited so as to have a thickness of 0.8 nm. It should be noted that if the thickness of the Mg film is larger than 0.8 nm, the Mg film cannot be sufficiently oxidized in the next Mg film oxidation step. Therefore, a step of depositing an Mg film again after the next Mg film oxidation step, and oxidizing the Mg film again is needed "Oxidation of Mg Film (St105)"

Next, the transfer apparatus carries the laminated body in the oxidation chamber 109. In the oxidation chamber 109, by any one of methods of plasma oxidation, radical oxidation, and natural oxidation, an Mg film is oxidized to form an MgO film. Specifically, in the case of natural oxidation, by placing the laminated body for 600 to 1000 sec at room temperature in an oxygen atmosphere at an oxygen pressure of 1 to 1000 Pa, it is possible to oxidize the laminated body. Because the MgO film is obtained by oxidizing an Mg film in an amorphous state, the MgO film is in an amorphous state.

"Deposition of Second CoFeB Film (St106)"

Next, the transfer apparatus carries the laminated body in the second PVD chamber 106. In the second PVD chamber 106, a second CoFeB film including CoFeB is deposited on the MgO film using a CoFeB target by DC sputtering. In the case where a CoFeB material is deposited instead of CoFeB, a CoFeB-X target is further added. The second CoFeB film is in an amorphous state, and becomes the free layer 50 in a step to be described later. The composition ratio of the second CoFeB film can be controlled by the target composition, and, for example, the composition ratio of x and y in $Co_xFe_yB_{(1-x+y)}$ may be $0.2 \leq x \leq 0.4$ and $0.4 \leq y \leq 0.6$. Moreover, for example, the second CoFeB film is deposited so as to have a thickness of not less than 0.5 nm and not more than 1.5 nm.

"Lamination of Capping Layer (St 107)"

Next, the transfer apparatus carries the laminated body in the fourth PVD chamber 108. In the fourth PVD chamber 108, the Ta layer 61 is deposited on the second CoFeB film using a Ta target by DC sputtering. For example, the Ta layer 61 is deposited so as to have a thickness of 5 nm.

Next, the transfer apparatus carries the substrate in the second PVD chamber 106. In the second PVD chamber 106, the Ru layer 62 is deposited on the Ta layer 61 using an Ru target by DC sputtering. For example, the Ru layer 62 is deposited so as to have a thickness of 10 nm.

In this way, the capping layer 60 including the Ta layer 61 and the Ru 62 is laminated.

"Heat Treatment (St108)"

Next, the transfer apparatus carries the laminated body in the heating chamber 103. In the heating chamber 103, the laminated body is subjected to a heat treatment. At this time, the heating temperature can be set up to 400° C., and the heating time can be set in minutes. By the heat treatment, the MgO film in an amorphous state is crystallized, and becomes a crystal having a (001) orientation. Specifically, the MgO film becomes the barrier layer 40. Moreover, the first CoFeB film in an amorphous state and the second CoFeB film in an amorphous state are also crystallized, and become crystals having a (001) orientation. The first CoFeB film and the second CoFeB film become a perpendicular magnetic film by the crystallization. Specifically, the first CoFeB film becomes the pinned layer 30, and the second CoFeB film becomes the free layer 50.

In this way, the TMR element 1 is manufactured. As described above, in this embodiment, MgO being a metal oxide is not directly deposited, Mg metal is deposited, and the Mg metal is subjected to an oxidation treatment to form MgO. Furthermore, by applying a heat treatment, the MgO film, the first CoFeB film, and the second CoFeB film are crystallized. Accordingly, it is possible to manufacture the perpendicular magnetization-type TMR element 1.

The TMR element 1 manufactured by the manufacturing method according to this embodiment has characteristics equivalent to those of a TMR element manufactured by directly depositing an MgO film. Specifically, it is possible to obtain an MR ratio of 40 to 70% in an area in which element resistance values are several tens to 1 k$\Omega\mu m^2$.

By the manufacturing method, it is possible to prevent the problem caused due to the deposition of MgO being a metal oxide, i.e., that when depositing an MgO film by a sputtering method, MgO attaches to and removes from the inner wall of a deposition chamber, thereby generating a lot of dust, which adversely affects the element. Moreover, although arc discharge is generated because the surface of the MgO film is electrically charged due to the deposition of MgO being an insulating material on the inner wall of the deposition chamber having a ground potential, it is possible to prevent plasma damage from being caused on the MgO film.

It should be noted that in the above-mentioned embodiment, the deposition (St104) and oxidation (St105) of an Mg film being a source of the barrier layer 40 are performed only once. However, it is limited to the case where the barrier layer 40 has a thin thickness (of not more than 0.8 nm.) In the case where the barrier layer 40 has a thicker thickness, oxidation may not sufficiently proceed if the Mg film is thickened. Therefore, in this case, by repeatedly performing the deposition (St104) and oxidation (St105) of the Mg film until a desired film thickness can be obtained, it is possible to form the barrier layer 40.

(Second Embodiment)

A second embodiment of the present invention will be described.

In the second embodiment, the same configuration as that according to the first embodiment will be denoted by the same reference numerals and a description thereof will be omitted. The configuration of a TMR element manufactured by a manufacturing method according to the second embodiment is the same as that of the TMR element 1 according to the first embodiment, and also a manufacturing apparatus used in the manufacturing method is the same as the manufacturing apparatus 100 according to the first embodiment. The second embodiment differs from the first embodiment in the timing when the Mg metal is oxidized to form MgO.

[Method of Manufacturing Tunneling Magnetoresistive Element]

A manufacturing method for the TMR element 1 using the manufacturing apparatus 100 be described.

Figure 5:
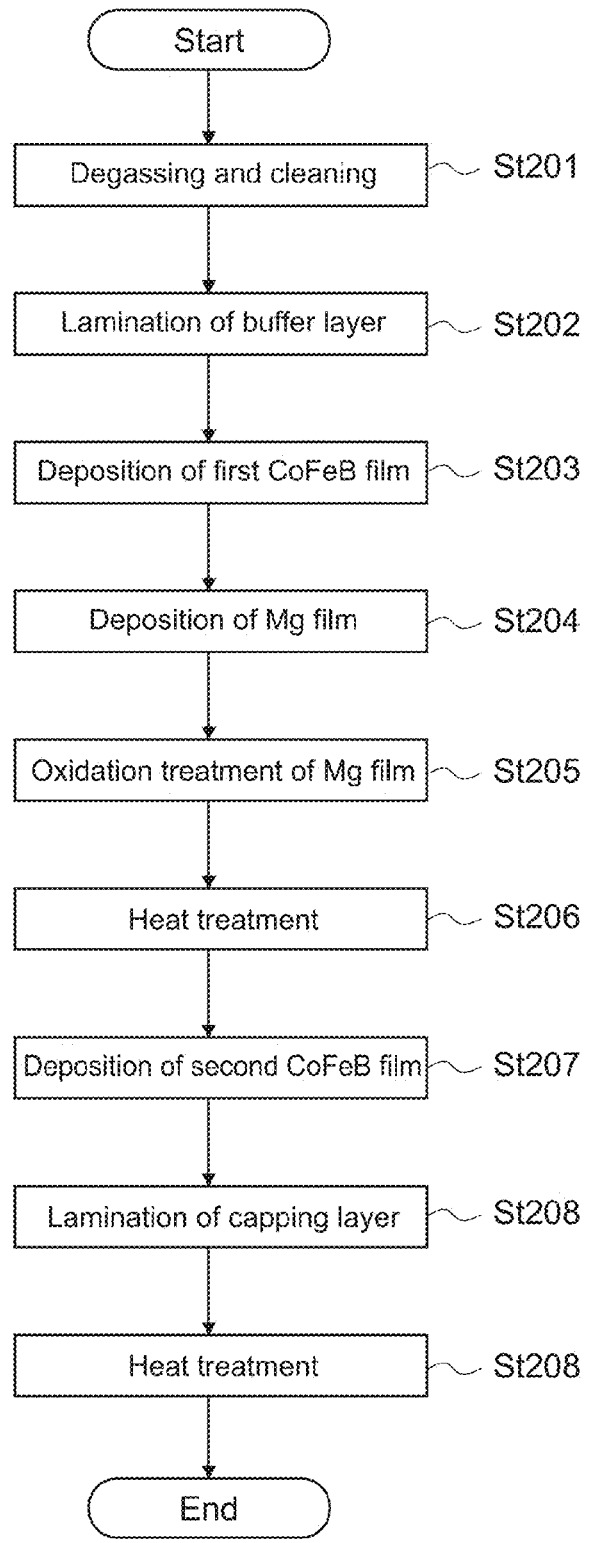
FIG. 5 is a flowchart showing a method of manufacturing the magnetoresistive element according to the second embodiment.

FIG. 5 is a flowchart showing the manufacturing method for the TMR element 1 according to the second embodiment.

Steps of degassing and cleaning (St201), lamination of a buffer layer (St202), deposition of a first CoFeB film (St203), and deposition of an Mg film (St204) are the same as those shown in the first embodiment.

"Oxidation of (St205)"

The transfer apparatus carries the laminated body in the oxidation chamber 109. In the oxidation chamber 109, by any one of methods of plasma oxidation, radical oxidation, and natural oxidation, an Mg film is oxidized to form an MgO film. Because the MgO film is obtained by oxidizing an Mg film in an amorphous state, the MgO film is in an amorphous state.

"Heat Treatment (St206)"

Next, the transfer apparatus carries the laminated body in the heating chamber 103. In the heating chamber 103, the laminated body is subjected to a heat treatment. At this time, the heating temperature can be set up to 400° C., and the heating time can be set in minutes. By the heat treatment, the MgO film in an amorphous state is crystallized, and becomes a crystal having a (001) orientation. Specifically, the MgO film becomes the barrier layer 40. Moreover, also the first CoFeB film in an amorphous state is crystallized, and become a crystal having a (001) orientation. The first CoFeB film becomes a perpendicular magnetic film by the crystallization. Specifically, the first CoFeB film becomes the pinned layer 30.

Here, the above-mentioned step of deposition of an Mg film (St205) and the step of heat treatment (St206) can be simultaneously performed. Specifically, by heating the laminated body in an oxygen plasma atmosphere, oxygen radical atmosphere, or oxygen gas atmosphere (hereinafter collectively referred to as oxygen atmosphere), the Mg film is oxidized. At the same time, crystallization of the MgO film and the first CoFeB film proceeds. It should be noted that if the heating is performed in an atmosphere other than the oxygen atmosphere, the step of deposition of an Mg film (St205) and the step of heat treatment (St206) may be separate steps.

"Deposition of Second CoFeB Film (St207)"

Next, the transfer apparatus carries the laminated body in the second PVD chamber 106. In the second PVD chamber 106, a second CoFeB film including CoFeB is deposited on the barrier layer 40 using a CoFeB target by DC sputtering. In the case where a CoFeB material is deposited instead of CoFeB, a CoFeB-X target is further added. The second CoFeB film is in an amorphous state, and becomes the free layer 50 in a step to be described later. The composition ratio of the second CoFeB film can be controlled by the target composition, and, for example, the composition ratio of x and y in $Co_xFe_yB_{(1-x+y)}$ may be $0.2 \leq x \leq 0.4$ and $0.4 \leq y \leq 0.6$. Moreover, for example, the second CoFeB film is deposited so as to have a thickness of not less than 0.5 nm and not more than 1.5 nm.

"Lamination of Capping Layer (St208)"

The step of lamination of a capping layer (St208) can be performed in the same way as the same step (St107) according to the first embodiment.

"Heat Treatment (St209)"

Next, the transfer apparatus carries the laminated body in the heating chamber 103. In the heating chamber 103, the laminated body is subjected to a heat treatment. At this time, the heating temperature can be set up to 400° C., and the heating time can be set in minutes. By the heat treatment, the second CoFeB film in an amorphous state is crystallized, and becomes a crystal having a (001) orientation. The second CoFeB film becomes a perpendicular magnetic film by the crystallization. Specifically, the second CoFeB film becomes the free layer 50.

In this way, the TMR element 1 is manufactured. Also in the manufacturing method according to this embodiment, as in the first embodiment, MgO being a metal oxide is not directly deposited, Mg metal is deposited, and the Mg metal is subjected to an oxidation treatment to form MgO. Therefore, it is possible to prevent the problem caused due to the deposition of MgO being a metal oxide. Furthermore, when the MgO film is subjected to plasma damage due to the above-mentioned problem when being formed, it is possible to maintain the CoFeB film under the MgO layer, which has been changed from an amorphous state to a crystallized state by being subjected to plasma damage similarly, in an amorphous state. Therefore, it is possible to cause the MgO film to grow on the CoFeB film so as to have a desired crystal orientation.

Moreover, in the second embodiment, unlike the first embodiment, the heat treatment performed on the first CoFeB film and the MgO film, and the heat treatment performed on the second CoFeB film are separate steps. Therefore, the heat treatment conditions for the first CoFeB film can be different from those for the second CoFeB film. It is possible to improve the degree of freedom in the manufacturing process. This is effective in the case where, for example, the film thickness of the first CoFeB film is significantly different from that of the second CoFeB film.

The present invention is not limited to the embodiment and various modifications can be made without departing from the gist of the present invention.

In the manufacturing methods according to the first and second embodiments, although the TMR element configured by laminating the buffer layer, the pinned layer, the barrier layer, the free layer, and the capping layer, is manufactured, it is not limited thereto. The present invention can be applied to a magnetoresistive element, as long as it includes at least a magnetic layer (pinned layer or free layer), which includes a material containing at least one of Co, Ni, and Fe, and a barrier layer adjacent to the magnetic layer, which includes MgO.

DESCRIPTION OF REFERENCE NUMERALS 1 tunneling magnetoresistive element
10 substrate
20 buffer layer
30 pinned layer
40 barrier layer
50 free layer
60 capping layer

The invention claimed is:

1. A method of manufacturing a magnetoresistive element, comprising:
    laminating a first layer on a base, the first layer including a material containing at least one of Co, Ni, and Fe;
    laminating a second layer on the first layer, the second layer including Mg;
    oxidizing the Mg in the second layer to form MgO by applying an oxidation treatment to a laminated body including the first layer and the second layer; and
    crystallizing the second layer by applying a heat treatment to the laminated body, and causing the first layer to be perpendicularly magnetized.

2. The method of manufacturing a magnetoresistive element according to claim 1, further comprising:
    laminating a third layer on the second layer after the step of applying the oxidation treatment to the laminated body and before the step of applying the heat treatment to the laminated body, the third layer including a material containing at least one of Co, Ni, and Fe; and
    causing the third layer to be perpendicularly magnetized in the step of applying the heat treatment to the laminated body.

3. The method of manufacturing a magnetoresistive element according to claim 2, wherein
    the first layer and the third layer include a CoFeB material,
    in the step of laminating the first layer, the first layer is laminated so as to have a thickness of not less than 0.6 nm and not more than 1.5 nm, and
    in the step of laminating the third layer, the third layer is laminated so as to have a thickness of not less than 0.6 nm and not more than 1.5 nm.

4. The method of manufacturing a magnetoresistive element according to claim 3, wherein
    in the step of laminating the first layer, the first layer is laminated directly on a fourth layer including Ta, the method of manufacturing a magnetoresistive element according to claim 3 further comprising laminating a fifth layer directly on the third layer, the fifth layer including Ta.

5. The method of manufacturing a magnetoresistive element according to claim 1, further comprising:
  laminating a third layer on the second layer after the step of applying the heat treatment to the laminated body, the third layer including a material containing at least one of Co, Ni, and Fe, and
  causing the third layer to be perpendicularly magnetized by applying a heat treatment to the laminated body.

6. The method of manufacturing a magnetoresistive element according to claim 5, wherein
  the first layer and the third layer include a CoFeB material,
  in the step of laminating the first layer, the first layer is laminated so as to have a thickness of not less than 0.6 nm and not more than 1.5 nm, and
  in the step of laminating the third layer, the third layer is laminated so as to have a thickness of not less than 0.6 nm and not more than 1.5 nm.

7. The method of manufacturing a magnetoresistive element according to claim 6, wherein
  in the step of laminating the first layer, the first layer is laminated directly on a fourth layer including Ta, the method of manufacturing a magnetoresistive element according to claim 6 further comprising
  laminating a fifth layer directly on the third layer, the fifth layer including Ta.

\* \* \* \* \*